US012222515B2

(12) United States Patent
Ockfen et al.

(10) Patent No.: US 12,222,515 B2
(45) Date of Patent: Feb. 11, 2025

(54) APPARATUS, SYSTEMS, AND METHODS FOR HEAT TRANSFER IN OPTICAL DEVICES

(71) Applicant: Facebook Technologies, LLC, Menlo Park, CA (US)

(72) Inventors: Alex Ockfen, Bothell, WA (US); Vivek Sahu, San Diego, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 272 days.

(21) Appl. No.: 17/853,463

(22) Filed: Jun. 29, 2022

(65) Prior Publication Data

US 2024/0004205 A1    Jan. 4, 2024

(51) Int. Cl.
*H05K 7/20*    (2006.01)
*G02B 27/01*    (2006.01)

(52) U.S. Cl.
CPC ..... *G02B 27/0176* (2013.01); *H05K 7/20963* (2013.01)

(58) Field of Classification Search
CPC combination set(s) only.
See application file for complete search history.

(56) References Cited

U.S. PATENT DOCUMENTS

| | | | | |
|---|---|---|---|---|
| 11,029,730 B2* | 6/2021 | Allin | | G06F 1/203 |
| 11,076,510 B2* | 7/2021 | Stellman | | G06F 1/163 |
| 11,132,055 B2* | 9/2021 | Jones | | G02B 27/0093 |
| 11,340,670 B2* | 5/2022 | Maric | | G06F 1/1656 |
| 11,435,784 B2* | 9/2022 | Allin | | G06F 1/203 |
| 11,513,573 B2* | 11/2022 | Choi | | H10K 59/8794 |
| 11,669,161 B2* | 6/2023 | Jones | | G02B 27/0176 |
| | | | | 345/156 |
| 11,960,092 B2* | 4/2024 | Greif | | G02B 6/26 |
| 11,966,267 B2* | 4/2024 | Dory | | G06F 1/206 |
| 2016/0179148 A1* | 6/2016 | Takagi | | G06F 1/163 |
| | | | | 345/8 |
| 2020/0150753 A1* | 5/2020 | De Nardi | | G06F 3/017 |
| 2020/0241611 A1* | 7/2020 | Allin | | G06F 1/20 |
| 2021/0278875 A1* | 9/2021 | Allin | | G02B 27/0176 |
| 2022/0146838 A1* | 5/2022 | Homma | | G02B 27/0176 |
| 2022/0157798 A1* | 5/2022 | Kim | | H10K 71/00 |
| 2022/0261053 A1* | 8/2022 | Dory | | H04R 1/1091 |
| 2022/0348747 A1* | 11/2022 | Ye | | C08K 3/014 |
| 2023/0247811 A1* | 8/2023 | Moghaddam | | H10K 50/87 |
| | | | | 361/688 |
| 2023/0247861 A1* | 8/2023 | Moghaddam | | G02B 7/008 |
| | | | | 361/697 |
| 2023/0276595 A1* | 8/2023 | Moghaddam | | G02B 27/0176 |
| | | | | 361/695 |
| 2024/0004205 A1* | 1/2024 | Ockfen | | G06F 1/203 |

* cited by examiner

*Primary Examiner* — Lisa Lea-Edmonds
(74) *Attorney, Agent, or Firm* — Greenberg Traurig, LLP

(57) ABSTRACT

An optical device may include (i) a heat source that produces heat while operating, (ii) a thermally conductive optical element that is optically transparent and that dissipates the heat produced by the heat source, and (iii) a thermally conductive connector that transfers the heat between the heat source and the thermally conductive optical element. Various other methods, systems, and computer-readable media are also disclosed.

20 Claims, 12 Drawing Sheets

APPARATUS, SYSTEMS, AND METHODS FOR HEAT TRANSFER IN OPTICAL DEVICES

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
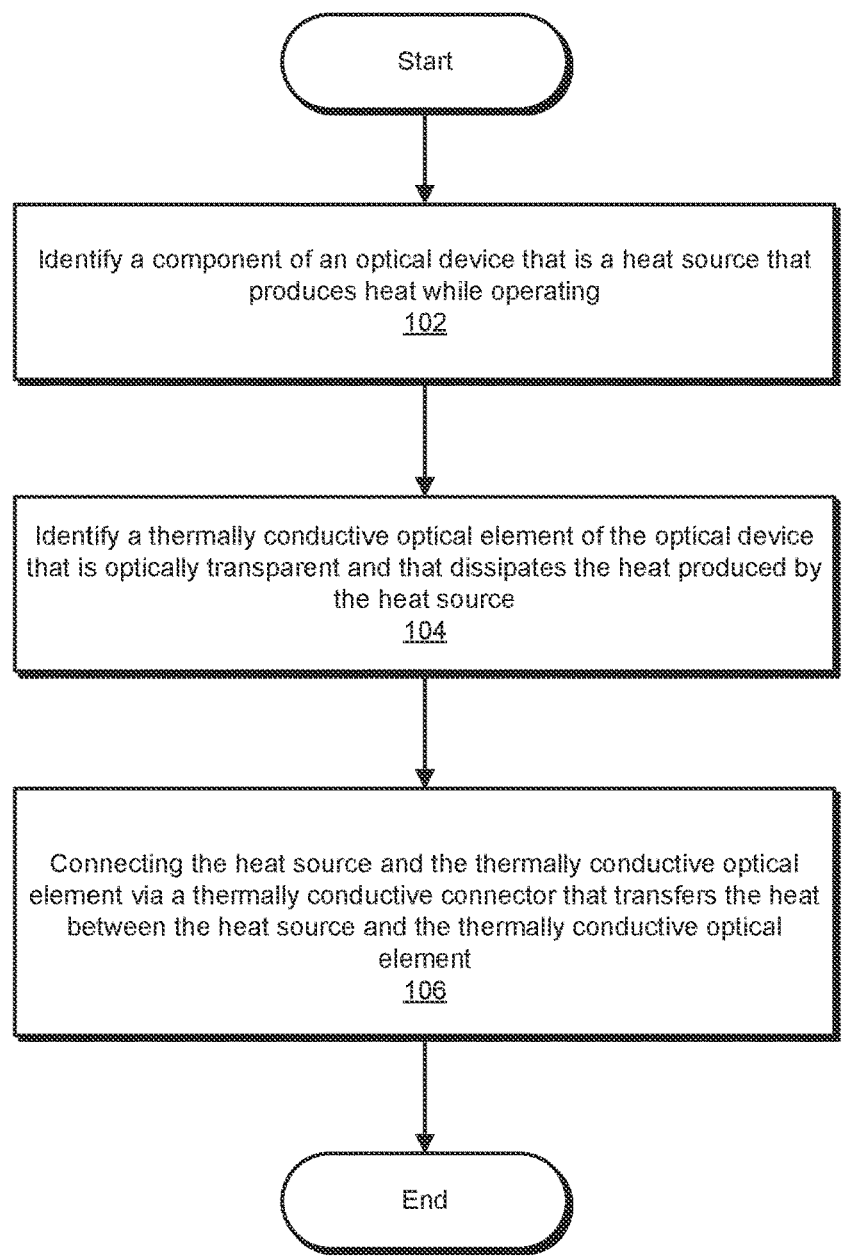
FIG. 1 is a flow diagram of an exemplary method for connecting a heat source to a heat sink in an optical device.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

Features from any of the embodiments described herein may be used in combination with one another in accordance with the general principles described herein. These and other embodiments, features, and advantages will be more fully understood upon reading the following detailed description in conjunction with the accompanying drawings and claims.

DETAILED DESCRIPTION OF EXEMPLARY EMBODIMENTS

The present disclosure is generally directed to systems and methods for dissipating heat within a space-constrained device with an optical element such as an augmented reality (AR) and/or virtual reality (VR) device. Currently, AR/VR devices may dissipate heat by connecting the heat source to the device's frame or to heat sinks within the device. Some device functionality, including display brightness, may be directly linked to how quickly a device can dissipate heat. Thus, especially with waveguide displays, slower heat dissipation may lead to less available brightness and a poorer visual experience. The systems described herein may use optical elements such as waveguides and/or lenses to conduct and dissipate heat. These optical elements may have a much higher surface area than that just between the heat source and the device's frame and, as such, may dissipate heat much more quickly. In the past, glass or other thermally insulating materials were used for optical elements and, as such, they could not be used for heat dissipation. In contrast, the systems described herein may use silicon carbide and other similar materials that are both capable of conducting heat and optically transparent to dissipate heat across lenses, waveguides, and/or other optical elements. In some embodiments, the systems described herein may include various means of attaching a heat source such as conductive foam, thermal straps, thermally conductive flexures, and/or direct heat-source-to-optical-element connections.

In some embodiments, the systems described herein may improve the functioning of a computing device by enabling the computing device to dissipate heat more efficiently and thus function at a higher level of performance for a longer period of time. Additionally, the systems described herein may improve the fields of augmented reality and/or virtual reality by improving the brightness and/or usability of displays for wearable AR/VR devices.

FIG. 1 is a flow diagram of an exemplary method 100 for assembling an optical device that dissipates heat via an optical element. In some examples, at step 102, the systems described herein may identify a component of an optical device that is a heat source that produces heat while operating.

The term heat source may generally refer to any component of a device that produces heat while operating. In some embodiments, a heat source may produce more heat than the heat source itself is capable of dissipating, causing the heat source to build up heat over time if the heat is not conducted elsewhere. In some examples, a heat source building up heat may interfere with the efficient operation of a device and/or the comfort of a wearer of the device. For example, if the heat source is a display element such as a light emitting diode (LED) and/or organic light emitting diode (OLED) screen, an increase in the heat of the display may cause a decrease in the brightness of the display. In one example, a temperature increase of five degrees Fahrenheit may correspond to a brightness decrease of ten percent, a significant and noticeable difference. In another example, a heat source may include a computing chip, such as a system-on-a-chip (SoC) integrated circuit that includes elements such as a central processing unit (CPU), memory interfaces, input/output (I/O) devices, and/or other interfaces. In this example, increased temperature may cause the SoC to perform computation functions less efficiently, trigger thermal throttling that impacts user experience, and/or cause components of the SoC to perform less reliably. Additional examples of heat sources may include, without limitation, an amplifier that facilitates audio playback through an optical device, any type of computing chip and/or processor, any type of transmitter, and/or any type of display surface or interface. In some embodiments, an optical device may include multiple heat sources.

The term optical device generally refers to any device designed to present visual information to a user. In some embodiments, an optical device may be worn on a user's head and include lenses and/or a screen placed in front of a user's eyes. In some examples, the constrained size of a wearable optical device (i.e., light and compact enough to be comfortably worn on a user's head) may make heat dissipation difficult. Examples of optical devices may include, without limitation, AR/VR headsets, AR/VR glasses, and/or any other type of wearable device with one or more optical elements.

In some examples, at step 104, the systems described herein may identify a thermally conductive optical element of the optical device that is optically transparent and that dissipates the heat produced by the heat source.

The term optical element generally refers to any element of a device that transmits light waves and directly facilitates the presentation of visual data to a user. For example, an optical element may present and/or magnify visual data. An optical element may be optically transparent; that is, an optical element may allow the transmission of light waves through the optical element rather than reflecting the light waves. Examples of optical elements may include, without limitation, lenses, optical waveguides, and/or optically transparent coatings. An optical waveguide may be any structure that guides light waves, such as transparent dielectric waveguides and/or optical fiber waveguides. In some embodiments, an optical element may be thermally conductive in that the optical element may conduct heat efficiently and/or at a high rate (e.g., as opposed to thermally insulating material that may conduct heat at very low rates). For example, a thermally conductive element may conduct heat a hundred or a thousand times more efficiently than a thermally insulating material. In some embodiments, an optical element may dissipate heat into the surrounding environment via convection. In some examples, an optical element may both spread and dissipate heat.

In some examples, at step 106, the systems described herein may connect the heat source and the thermally conductive optical element via a thermally conductive connector that transfers the heat between the heat source and the thermally conductive optical element.

The systems described herein may use various types of thermally conductive connectors that are affixed to the heat source and/or optical element in various ways. The term thermally conductive connector generally refers to any component of a device and/or design feature of a device that transfers heat between two or more components of the device. In some embodiments, a thermally conductive connector may be created from special thermally conductive materials, such as conductive foam. In one embodiment, a thermally conductive connector may rely on the design of a device, such as a gap between two elements that is filled with thermally conductive gas. In some embodiments, multiple thermally conductive connectors and/or types of thermally conductive connectors may connect a heat source and a thermally conductive optical element. In some embodiments, a thermally conductive connector may include a radiative coating that improves heat transfer between coatings. Examples of thermally conductive connectors may include, without limitation, thermal straps, conductive foam, thermal paste, gas, thermally conductive flexures, and/or direct heat-source-to-optical-element connections. Examples of thermally conductive connectors and ways in which those connectors may be arranged will be discussed in greater detail in connection with FIGS. 2-9.

Figure 2:
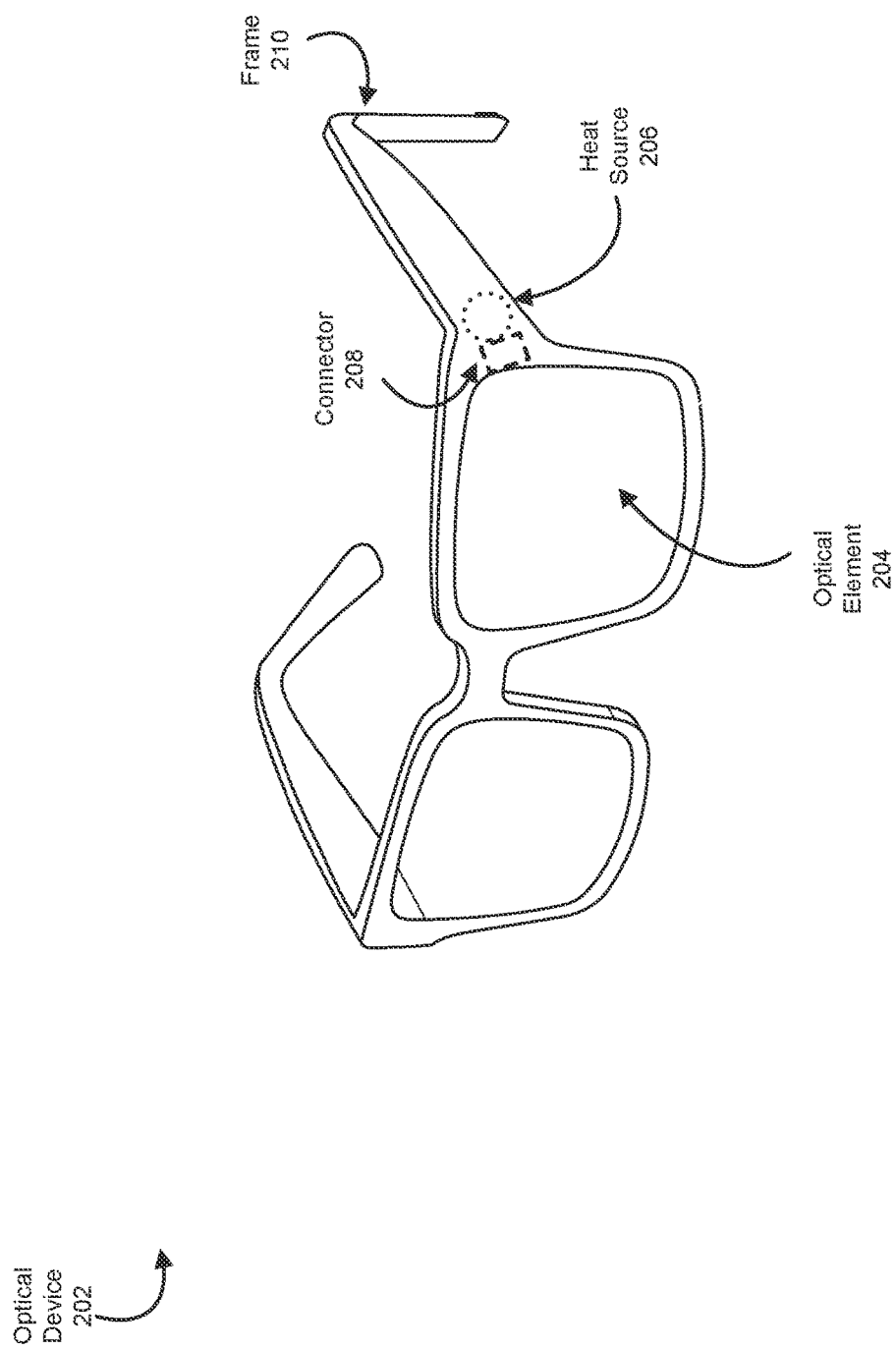
FIG. 2 is an illustration of an exemplary optical device.

FIG. 2 is an illustration of an example optical device 202 with a heat source 206 connected to an optical element 204 via a connector 208. In one embodiment, optical device 202 may be a pair of AR glasses that include a frame 210 that is designed to be worn on a user's head and that houses heat source 206, optical element 204, and connector 208. In this example, optical element 204 may include glasses lenses. Because of the large surface area of the lenses in comparison to other elements of the device, the lenses may be an efficient means of heat dissipation for heat source 206.

Figure 3:
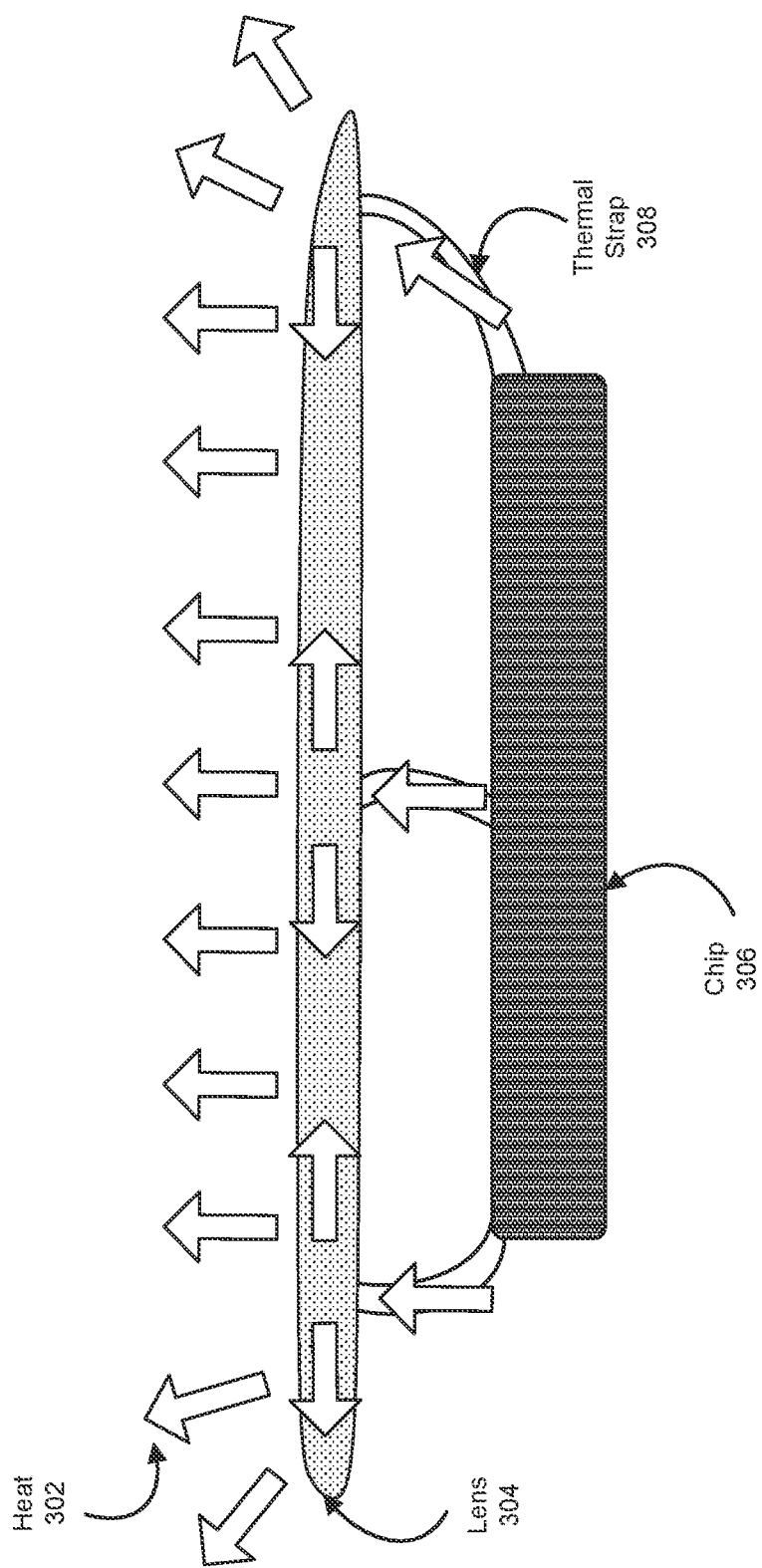
FIG. 3 is an illustration of heat movement within an exemplary optical device.

In some embodiments, the systems described herein may facilitate the movement of heat from a heat source to the external environment. For example, FIG. 3 illustrates a chip 306 that acts as a heat source and is connected to a lens 304 via a set of thermal straps that includes a thermal strap 308. Thermal strap 308 generally represents any flexible connector made of a thermally conductive material including but not limited to copper, aluminum, graphite fiber, carbon fiber, and/or graphene. In one example, chip 306 may produce heat 302 that then travels through the set of thermal straps and into lens 304, which may be made of a thermally conductive material such as specially designed conductive plastic, optically transparent ceramics, and/or a layer of optically transparent gemstone (e.g., sapphire or diamond). Due to the positioning of the thermal straps and/or the natural movement of thermal energy, heat 302 may become distributed across the surface of lens 304 and then may dissipate into the air, thus reducing the overall heat stored within the optical device.

Figure 4:
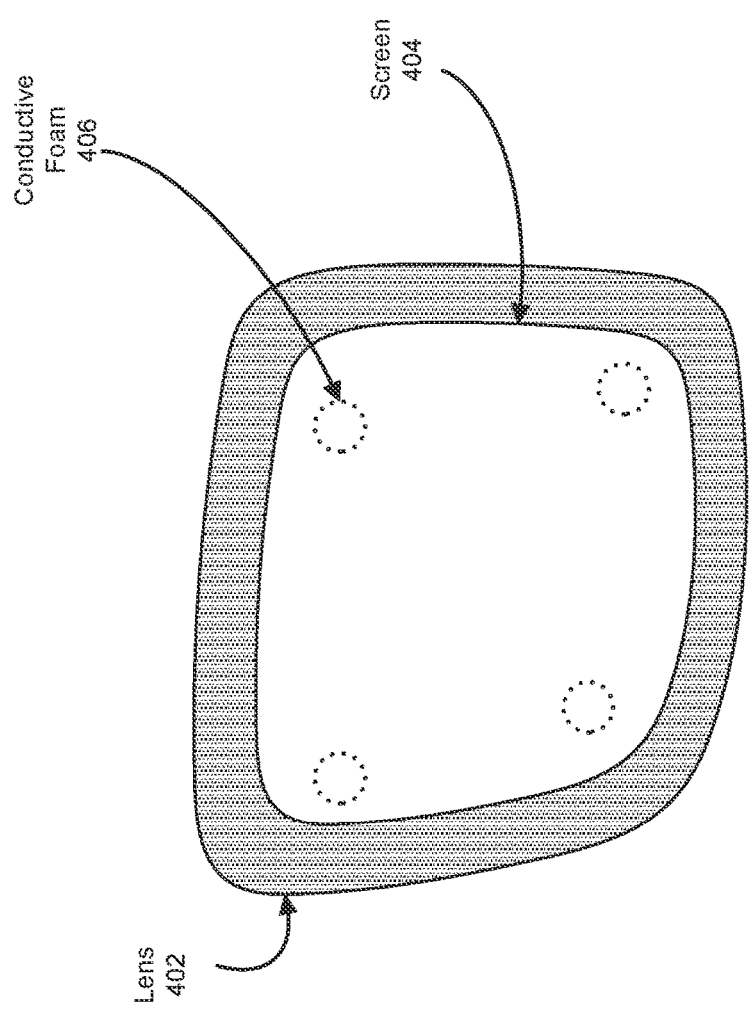
FIG. 4 is an illustration of an exemplary heat source, heat sink, and connector.

In some embodiments, the systems described herein may use conductive foam to connect a display screen that produces heat and a lens that dissipates heat and/or any other type of heat source to any other type of optical element. For example, as illustrated in FIG. 4, a lens 402 may be connected to a screen 404 by one or more instances of conductive foam 406. In one embodiment, conductive foam 406 may be polyethylene and/or polyurethane foam filled with carbon and/or wrapped with a thermal conductor (e.g., graphite, copper and/or another conductive metal, etc.). In some examples, conductive foam 406 may include low-density open-cell foam while in other examples, conductive foam 406 may include high-density closed-cell foam. In some embodiments, conductive foam 406 may be positioned so as to create an even distribution of heat across lens 402. In one example, screen 404 may display AR objects and/or information in an overlay over the real-world visual information transmitted through lens 402 as part of a pair of AR glasses and/or an AR headset. In one embodiment, screen 404 may project images onto lens 402.

Figure 5:
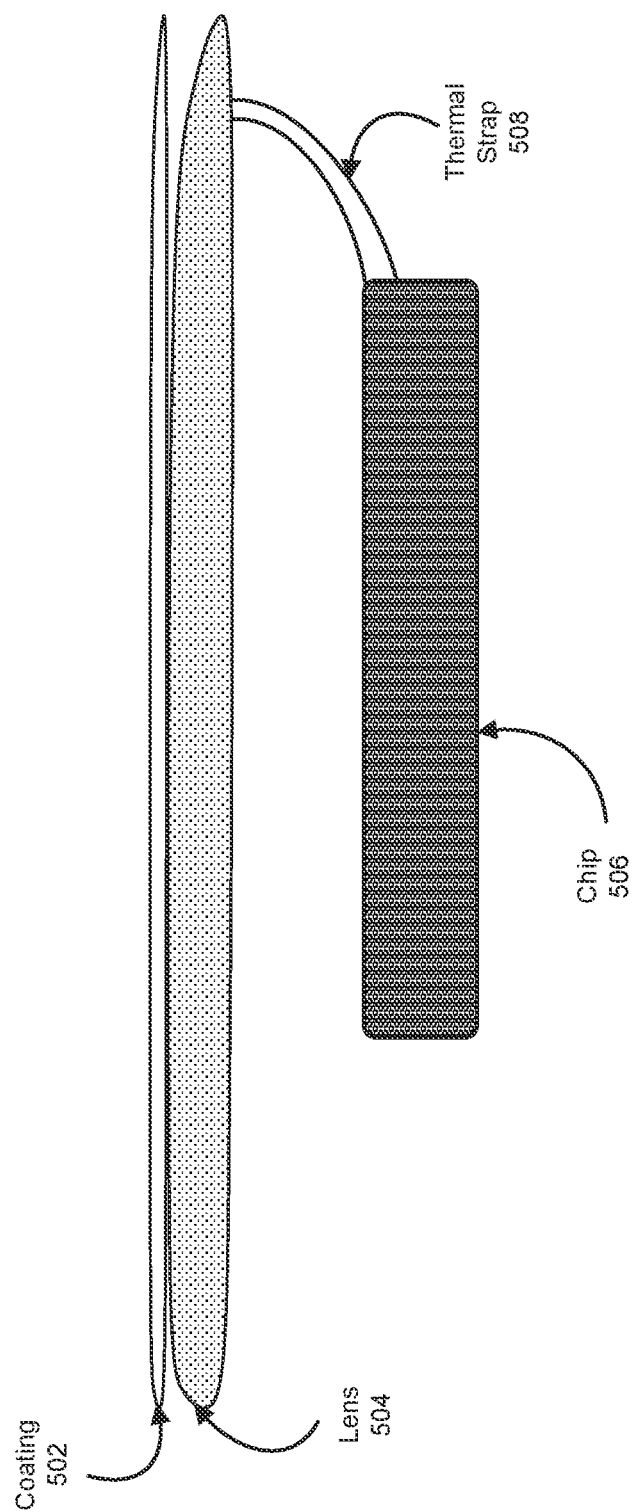
FIG. 5 is an illustration of an additional exemplary heat source, heat sink, and connector.

In some embodiments, an optically transparent thermally conductive coating applied to an optical element may facilitate heat dissipation. For example, as illustrated in FIG. 5, a lens 504 may have a coating 502 that is both thermally conductive and optically transparent. For example, coating 502 may be a thermally conductive film (e.g., affixed to a non-thermally conductive element such as a glass lens and/or a thermally conductive element such as an optically transparent gemstone lens). In one embodiment, a chip 506 (e.g., a SoC chip or other computing chip) may produce heat that is transferred via a thermal strap 508 to lens 504 and/or directly to thermal coating 502. Thermal coating 502 may then dissipate heat into the environment.

Figure 6:
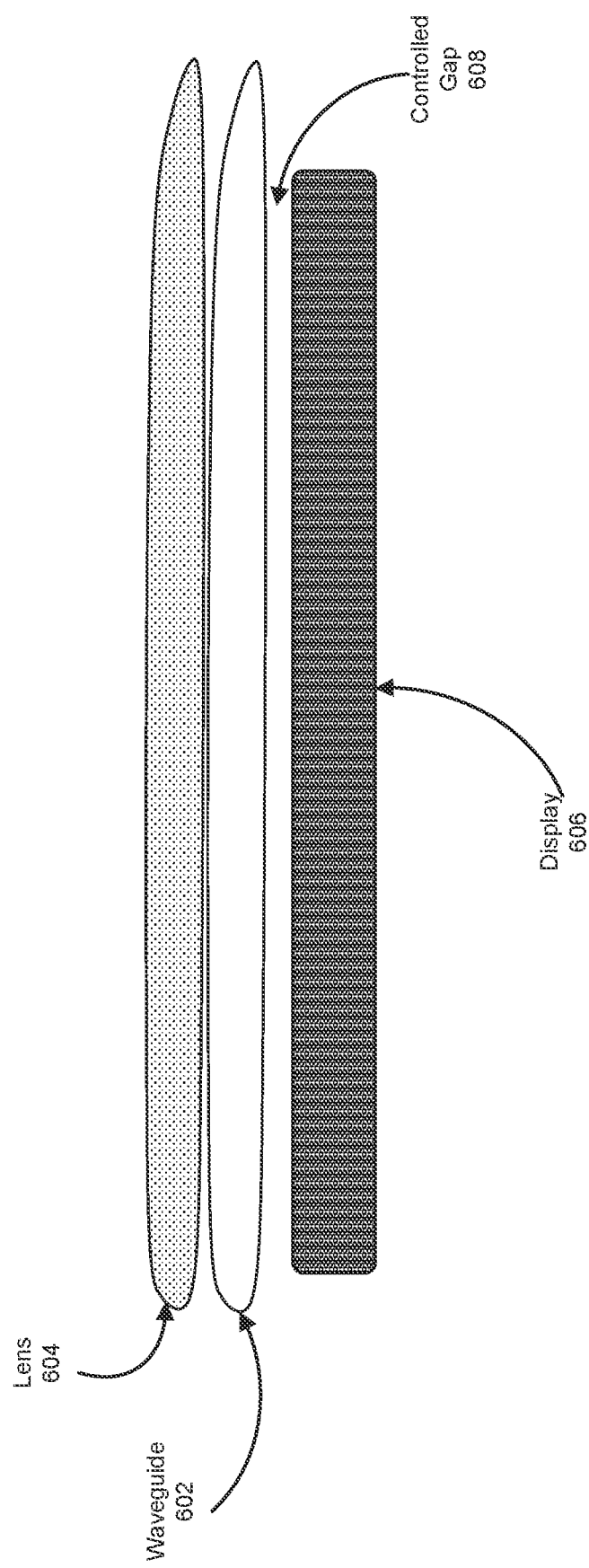
FIG. 6 is an illustration of an additional exemplary heat source, heat sink, and connector.

In some embodiments, the arrangement of components in an optical device may create a thermal conductor out of air or another gas. For example, as illustrated in FIG. 6, a display 606 may be seated in an optical device such that there is a controlled gap 608 between display 606 and a waveguide 602 that conveys light waves to a lens 604. In some examples, controlled gap 608 may act as a thermal conductor between display 606 and waveguide 602. In one embodiment, controlled gap 608 may be filled with a thermally conductive gas such as hydrogen or helium that acts as a thermal conductor between display 606 and waveguide 602. In some embodiments, waveguide 602 may be made of a thermally conductive material such as silicon carbide and may dissipate the heat produced by display 606. Additionally or alternatively, waveguide 602 may conduct the heat to lens 604 which may dissipate the heat.

Figure 7:
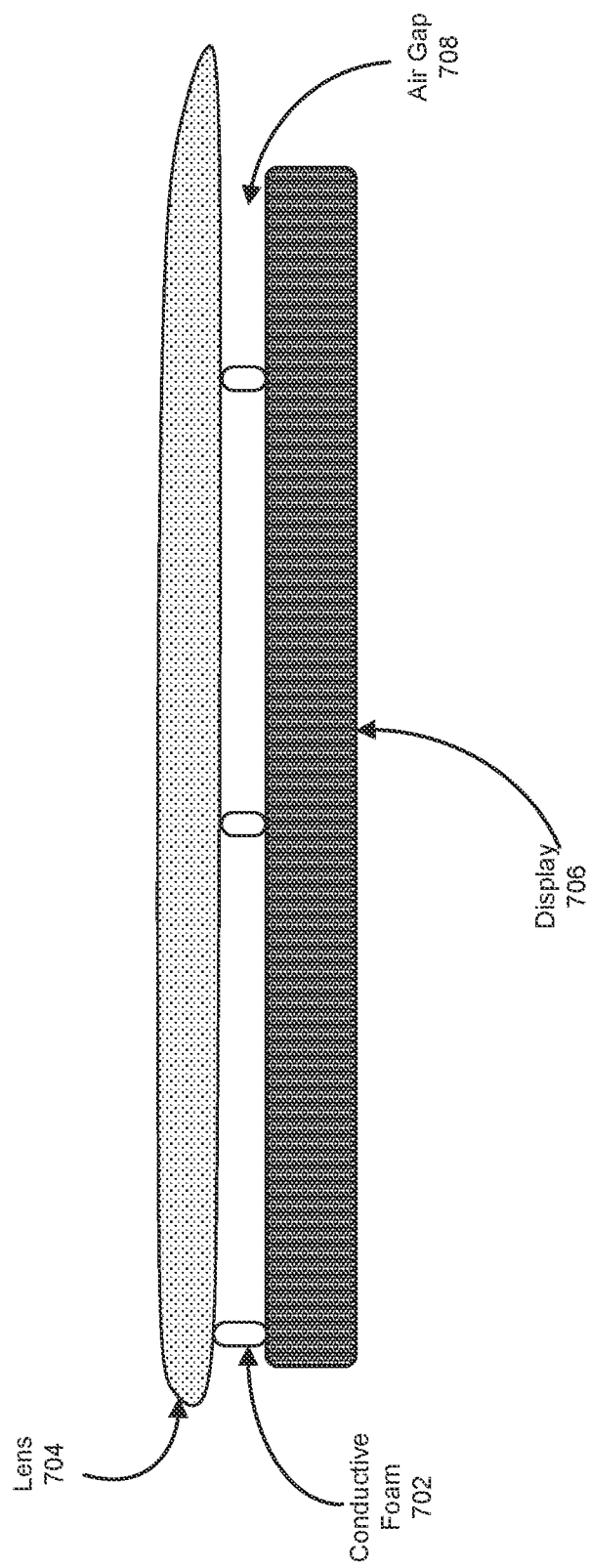
FIG. 7 is an illustration of an exemplary heat source, heat sink, and multiple connectors.

In some embodiments, the systems described herein may include multiple thermal conductors and/or types of thermal conductors in order to minimize the heat gradient across the optical element and/or transfer heat efficiently from the heat source. For example, as illustrated in FIG. 7, a display 706 that generates heat may be connected to a lens 704 that dissipates the heat via both multiple instances of conductive foam 702 and a controlled gap 708 that may be filled with a conductive gas. In some embodiments, having multiple thermal conductors may minimize the heat gradient across lens 704, reducing the risk of lens 704 deforming due to different levels of heat in different areas.

Figure 8:
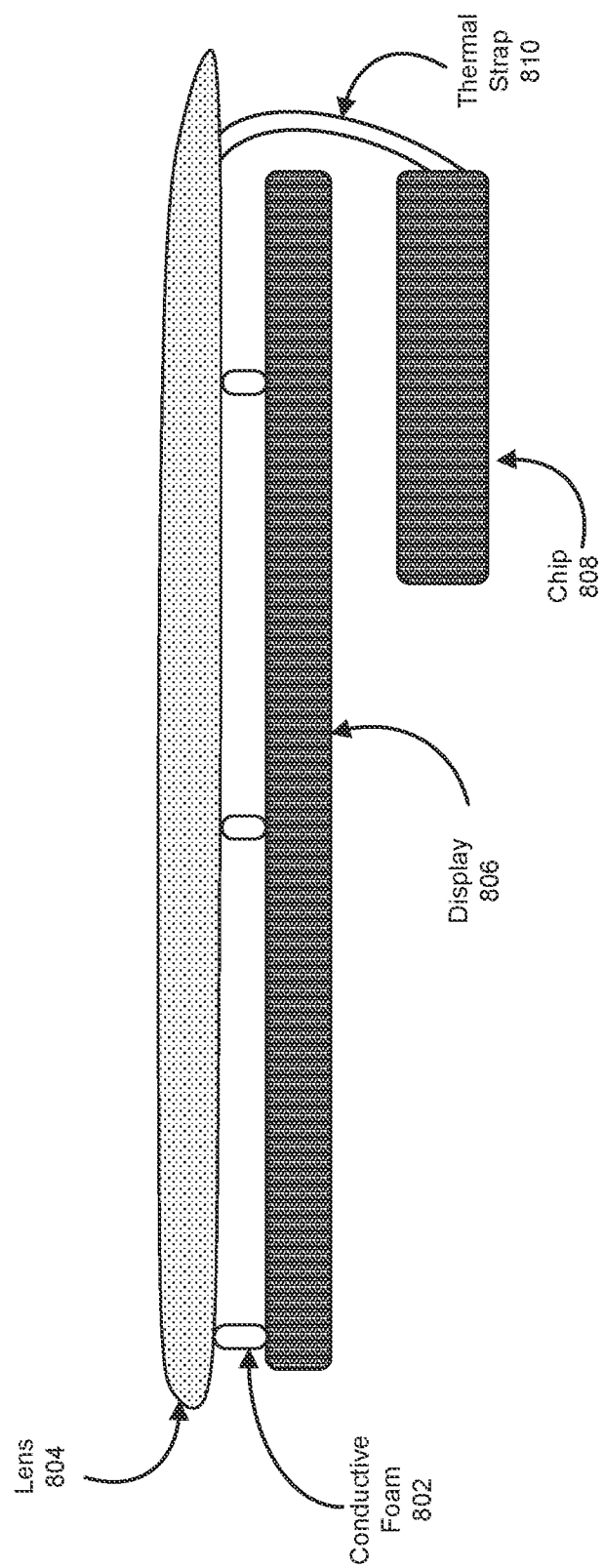
FIG. 8 is an illustration of multiple exemplary heat sources, a heat sink, and connectors.

In some embodiments, an optical device may include multiple heat sources. In these embodiments, multiple thermal conductors may connect the heat sources to one or more thermally conductive optical elements. For example, as illustrated in FIG. 8, an optical device may include both a chip 808 and a display 806 that produce heat. In one example, a thermal strap 810 may connect chip 808 to a lens 804 while conductive foam 802 may connect display 806 to lens 804. Although illustrated with a single optical element dissipating heat from multiple heat sources, in other embodiments, each heat source may be connected to a different optical element and/or to multiple optical elements.

Figure 9:
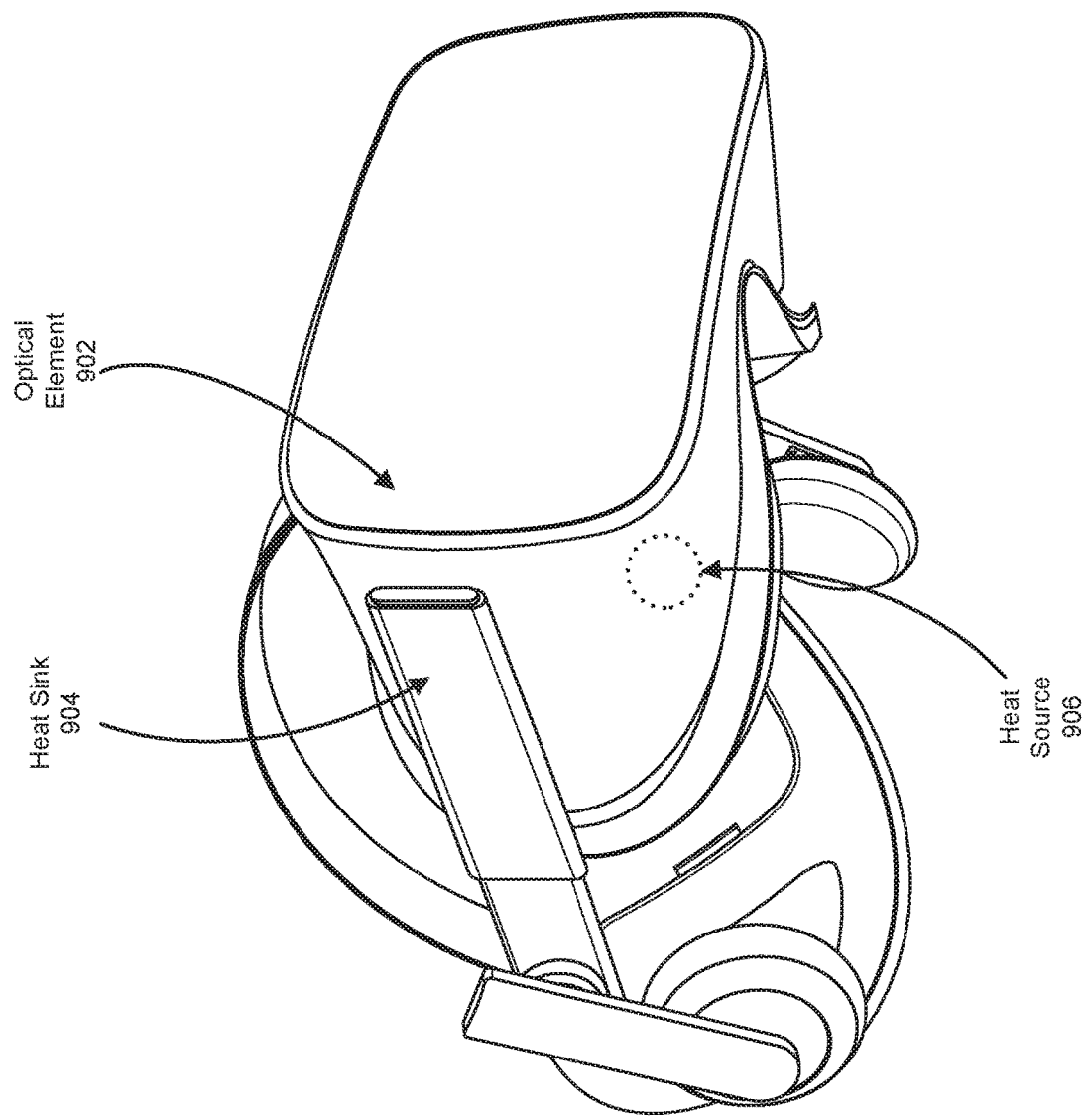
FIG. 9 is an illustration of an exemplary heat source, multiple heat sinks, and connectors.

In some embodiments, an optical device may include an additional heat sink that may not be an optical element. For example, as illustrated in FIG. 9, a heat source 906 may be connected to an optical element 902, such as a lens of an AR headset. In some embodiments, optical element 902 may be connected to an additional heat sink 904 such as a thermally conductive component of a frame of an AR headset, enabling optical element 902 to dissipate heat both into the air and into heat sink 904. Additionally or alternatively, heat sink 904 may be connected directly to heat source 906. Heat sink 904 may be connected to optical element 902 and/or heat source 906 via any type of thermal conductor such as a thermal strap, conductive foam, etc.

Figure 10:
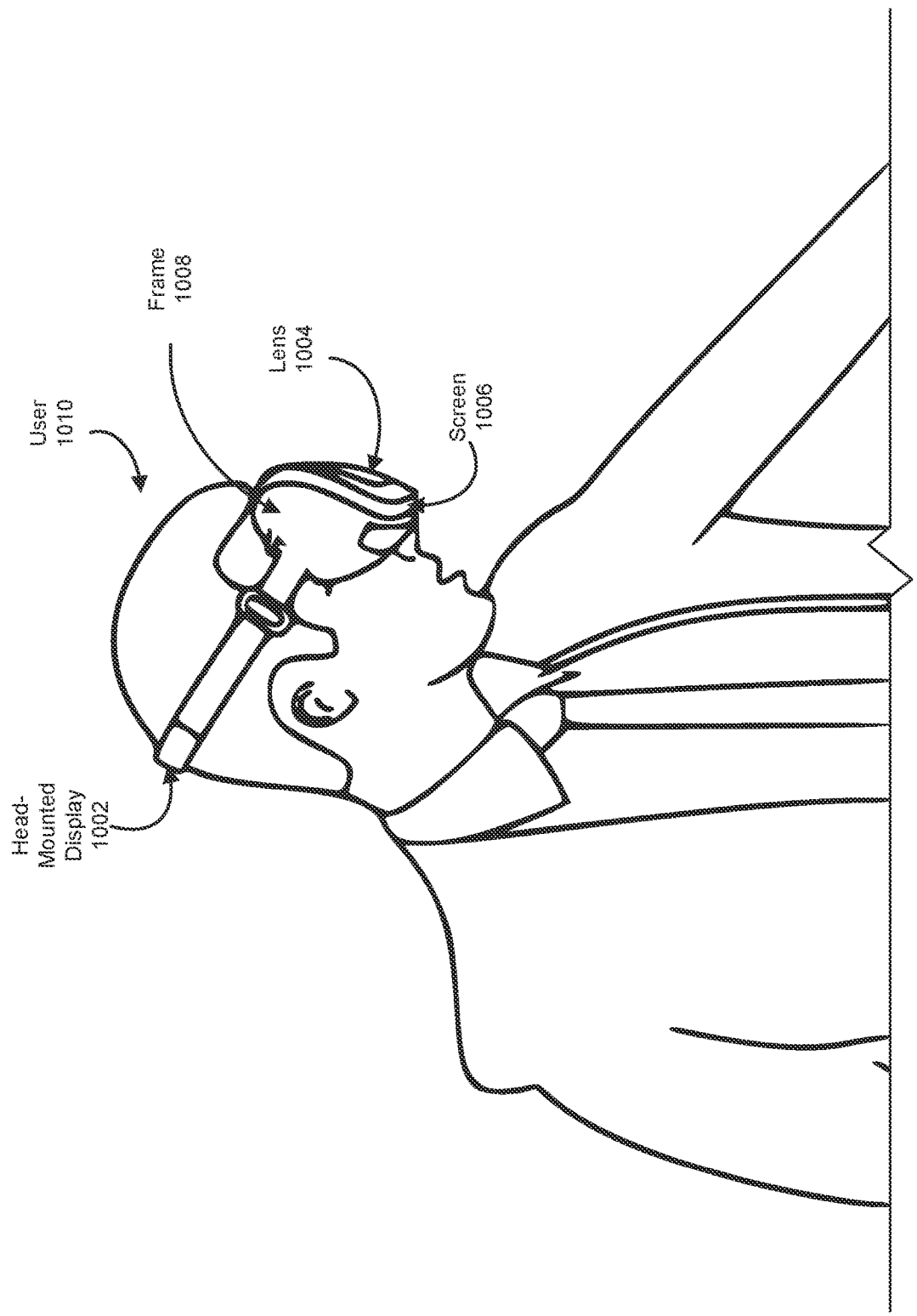
FIG. 10 is an illustration of an exemplary head-mounted display for interacting with augmented reality or virtual reality environments.
Figure 11:
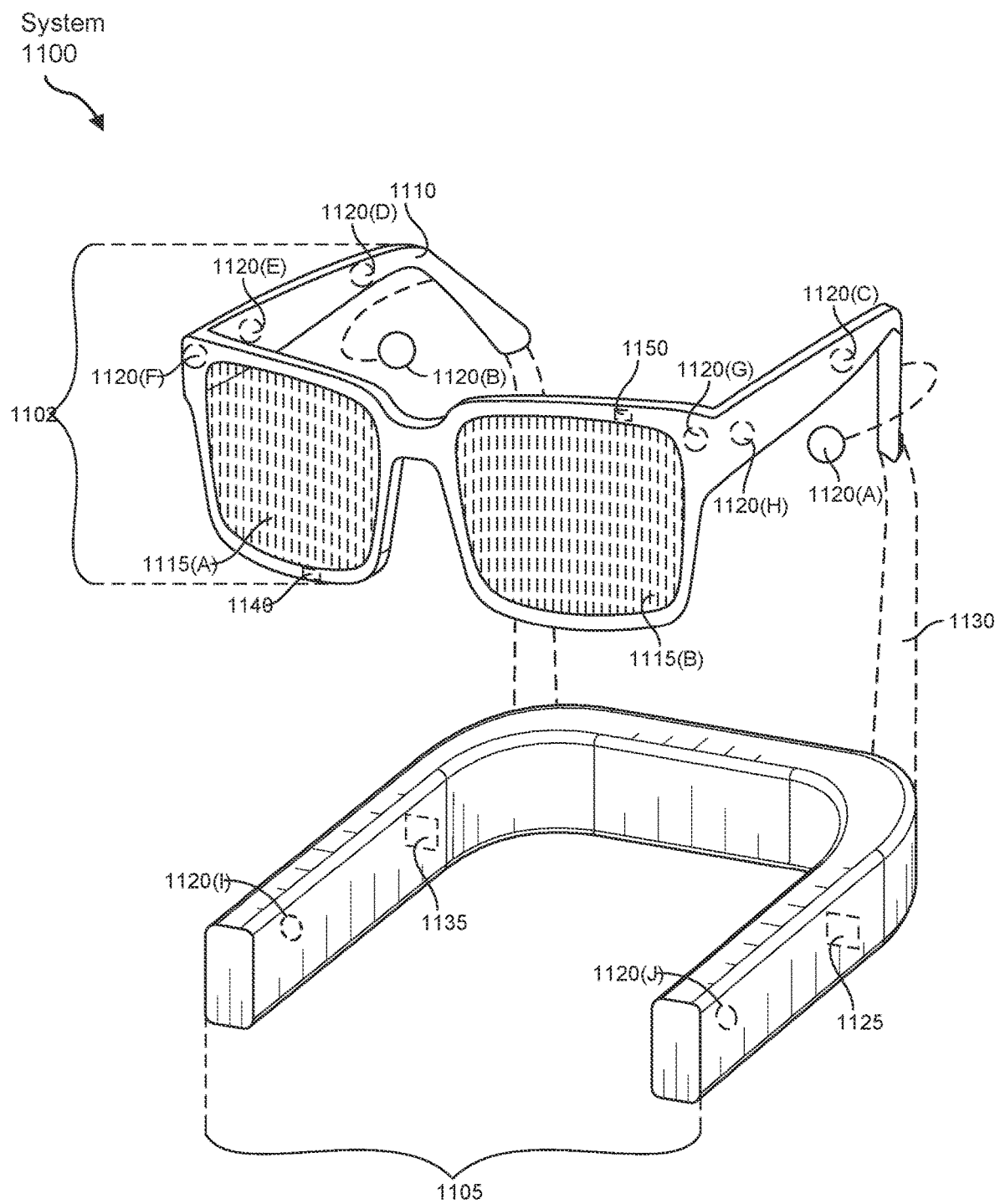
FIG. 11 is an illustration of exemplary augmented-reality glasses that may be used in connection with embodiments of this disclosure.

In some embodiments, an optical device may be a head-mounted display for interacting with AR and/or VR environments. For example, as illustrated in FIG. 10, a user 1010 may wear a head-mounted display 1002 that may have a frame 1008 that houses a lens 1004, a screen 1006, and/or other components and that is designed to be worn by a user such as user 1010. In some embodiments, screen 1006 may be a heat source and/or lens 1004 may dissipate heat. In some examples, user 1010 may hear head-mounted display 1002 for an extended period of time (e.g., several hours), causing heat to build up in head-mounted display 1002 unless that heat is dissipated. By dissipating the heat generated by screen 1006 via lens 1004, the systems described herein may improve the performance and longevity of head-mounted display 1002 without adding heavy and/or bulky components that function solely to dissipate heat (e.g., fans) but do not have another purpose within head-mounted display 1002 (e.g., as an optical element).

As described above, the systems and methods described herein may improve the functioning of an optical device by using optic elements to dissipate heat from heat sources within the device. This may increase the usability of the device, for example by enabling the screen of an AR headset to function at maximum brightness for a longer period of time. By using optical elements that are already part of the device rather than adding specialized cooling elements, the systems described herein may dissipate heat efficiently without meaningfully increasing the dimensions or mass of the device, enabling wearable devices such as head-mounted displays to remain comfortable for the user.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Figure 12:
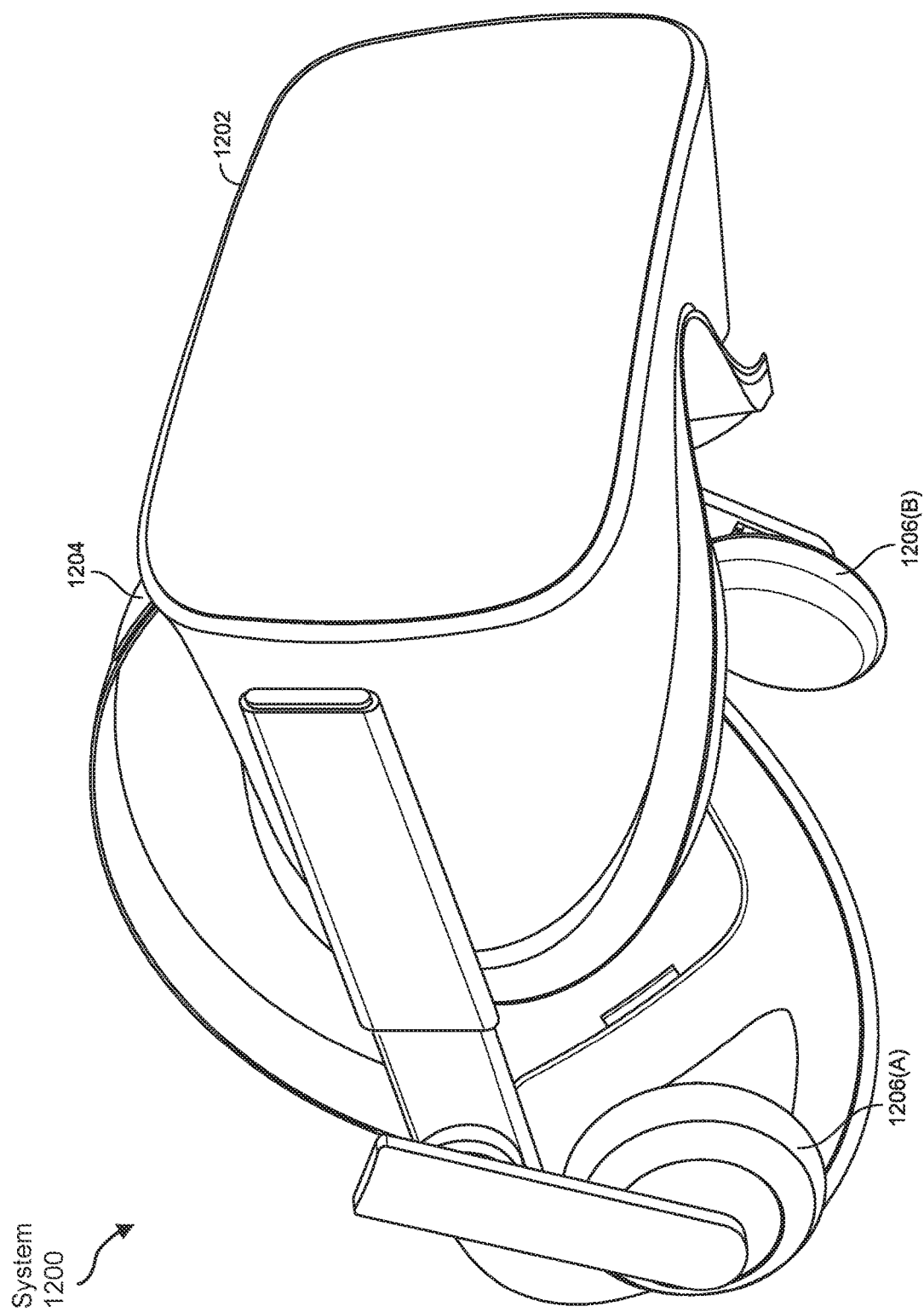
FIG. 12 is an illustration of an exemplary virtual-reality headset that may be used in connection with embodiments of this disclosure.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 100 in FIG. 1) or that visually immerses a user in an artificial reality (such as, e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Turning to FIG. 1, augmented-reality system 100 may include an eyewear device 102 with a frame 110 configured to hold a left display device 115(A) and a right display device 115(B) in front of a user's eyes. Display devices 115(A) and 115(B) may act together or independently to present an image or series of images to a user. While augmented-reality system 100 includes two displays, embodiments of this disclosure may be implemented in augmented-reality systems with a single NED or more than two NEDs.

In some embodiments, augmented-reality system 100 may include one or more sensors, such as sensor 140. Sensor 140 may generate measurement signals in response to motion of augmented-reality system 100 and may be located on substantially any portion of frame 110. Sensor 140 may represent one or more of a variety of different sensing mechanisms, such as a position sensor, an inertial measurement unit (IMU), a depth camera assembly, a structured light emitter and/or detector, or any combination thereof. In some embodiments, augmented-reality system 100 may or may not include sensor 140 or may include more than one sensor. In embodiments in which sensor 140 includes an IMU, the IMU may generate calibration data based on measurement signals from sensor 140. Examples of sensor 140 may include, without limitation, accelerometers, gyroscopes, magnetometers, other suitable types of sensors that detect motion, sensors used for error correction of the IMU, or some combination thereof.

In some examples, augmented-reality system 100 may also include a microphone array with a plurality of acoustic transducers 120(A)-120(J), referred to collectively as acoustic transducers 120. Acoustic transducers 120 may represent transducers that detect air pressure variations induced by sound waves. Each acoustic transducer 120 may be configured to detect sound and convert the detected sound into an electronic format (e.g., an analog or digital format). The microphone array in FIG. 1 may include, for example, ten acoustic transducers: 120(A) and 120(B), which may be designed to be placed inside a corresponding ear of the user, acoustic transducers 120(C), 120(D), 120(E), 120(F), 120(G), and 120(H), which may be positioned at various locations on frame 110, and/or acoustic transducers 120(I) and 120(J), which may be positioned on a corresponding neckband 105.

In some embodiments, one or more of acoustic transducers 120(A)-(J) may be used as output transducers (e.g., speakers). For example, acoustic transducers 120(A) and/or 120(B) may be earbuds or any other suitable type of headphone or speaker.

The configuration of acoustic transducers 120 of the microphone array may vary. While augmented-reality system 100 is shown in FIG. 1 as having ten acoustic transducers 120, the number of acoustic transducers 120 may be greater or less than ten. In some embodiments, using higher numbers of acoustic transducers 120 may increase the amount of audio information collected and/or the sensitivity and accuracy of the audio information. In contrast, using a lower number of acoustic transducers 120 may decrease the computing power required by an associated controller 150 to process the collected audio information. In addition, the position of each acoustic transducer 120 of the microphone array may vary. For example, the position of an acoustic transducer 120 may include a defined position on the user, a defined coordinate on frame 110, an orientation associated with each acoustic transducer 120, or some combination thereof.

Acoustic transducers 120(A) and 120(B) may be positioned on different parts of the user's ear, such as behind the pinna, behind the tragus, and/or within the auricle or fossa. Or, there may be additional acoustic transducers 120 on or surrounding the ear in addition to acoustic transducers 120 inside the ear canal. Having an acoustic transducer 120 positioned next to an ear canal of a user may enable the microphone array to collect information on how sounds arrive at the ear canal. By positioning at least two of acoustic transducers 120 on either side of a user's head (e.g., as binaural microphones), augmented-reality device 100 may simulate binaural hearing and capture a 3D stereo sound field around about a user's head. In some embodiments, acoustic transducers 120(A) and 120(B) may be connected to augmented-reality system 100 via a wired connection 130, and in other embodiments acoustic transducers 120(A) and 120(B) may be connected to augmented-reality system 100 via a wireless connection (e.g., a BLUETOOTH connection). In still other embodiments, acoustic transducers 120(A) and 120(B) may not be used at all in conjunction with augmented-reality system 100.

Acoustic transducers 120 on frame 110 may be positioned in a variety of different ways, including along the length of the temples, across the bridge, above or below display devices 115(A) and 115(B), or some combination thereof. Acoustic transducers 120 may also be oriented such that the microphone array is able to detect sounds in a wide range of directions surrounding the user wearing the augmented-reality system 100. In some embodiments, an optimization process may be performed during manufacturing of augmented-reality system 100 to determine relative positioning of each acoustic transducer 120 in the microphone array.

In some examples, augmented-reality system 100 may include or be connected to an external device (e.g., a paired device), such as neckband 105. Neckband 105 generally represents any type or form of paired device. Thus, the following discussion of neckband 105 may also apply to various other paired devices, such as charging cases, smart watches, smart phones, wrist bands, other wearable devices, hand-held controllers, tablet computers, laptop computers, other external compute devices, etc.

As shown, neckband 105 may be coupled to eyewear device 102 via one or more connectors. The connectors may be wired or wireless and may include electrical and/or non-electrical (e.g., structural) components. In some cases, eyewear device 102 and neckband 105 may operate independently without any wired or wireless connection between them. While FIG. 1 illustrates the components of eyewear device 102 and neckband 105 in example locations on eyewear device 102 and neckband 105, the components may be located elsewhere and/or distributed differently on eyewear device 102 and/or neckband 105. In some embodiments, the components of eyewear device 102 and neckband 105 may be located on one or more additional peripheral devices paired with eyewear device 102, neckband 105, or some combination thereof.

Pairing external devices, such as neckband 105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 100 may be provided by a paired device or shared between a paired device and an eyewear device, thus reducing the weight, heat profile, and form factor of the eyewear device overall while still retaining desired functionality. For example, neckband 105 may allow components that would otherwise be included on an eyewear device to be included in neckband 105 since users may tolerate a heavier weight load on their shoulders than they would tolerate on their heads. Neckband 105 may also have a larger surface area over which to diffuse and disperse heat to the ambient environment. Thus, neckband 105 may allow for greater battery and computation capacity than might otherwise have been possible on a stand-alone eyewear device. Since weight carried in neckband 105 may be less invasive to a user than weight carried in eyewear device 102, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 105 may be communicatively coupled with eyewear device 102 and/or to other devices. These other devices may provide certain functions (e.g., tracking, localizing, depth mapping, processing, storage, etc.) to augmented-reality system 100. In the embodiment of FIG. 1, neckband 105 may include two acoustic transducers (e.g., 120(I) and 120(J)) that are part of the microphone array (or potentially form their own microphone subarray). Neckband 105 may also include a controller 125 and a power source 135.

Acoustic transducers 120(I) and 120(J) of neckband 105 may be configured to detect sound and convert the detected sound into an electronic format (analog or digital). In the embodiment of FIG. 1, acoustic transducers 120(I) and 120(J) may be positioned on neckband 105, thereby increasing the distance between the neckband acoustic transducers 120(I) and 120(J) and other acoustic transducers 120 positioned on eyewear device 102. In some cases, increasing the distance between acoustic transducers 120 of the microphone array may improve the accuracy of beamforming performed via the microphone array. For example, if a sound is detected by acoustic transducers 120(C) and 120(D) and the distance between acoustic transducers 120(C) and 120(D) is greater than, e.g., the distance between acoustic transducers 120(D) and 120(E), the determined source location of the detected sound may be more accurate than if the sound had been detected by acoustic transducers 120(D) and 120(E).

Controller 125 of neckband 105 may process information generated by the sensors on neckband 105 and/or augmented-reality system 100. For example, controller 125 may process information from the microphone array that describes sounds detected by the microphone array. For each detected sound, controller 125 may perform a direction-of-arrival (DOA) estimation to estimate a direction from which the detected sound arrived at the microphone array. As the microphone array detects sounds, controller 125 may populate an audio data set with the information. In embodiments in which augmented-reality system 100 includes an inertial measurement unit, controller 125 may compute all inertial and spatial calculations from the IMU located on eyewear device 102. A connector may convey information between augmented-reality system 100 and neckband 105 and between augmented-reality system 100 and controller 125. The information may be in the form of optical data, electrical data, wireless data, or any other transmittable data form. Moving the processing of information generated by augmented-reality system 100 to neckband 105 may reduce weight and heat in eyewear device 102, making it more comfortable to the user.

Power source 135 in neckband 105 may provide power to eyewear device 102 and/or to neckband 105. Power source 135 may include, without limitation, lithium ion batteries, lithium-polymer batteries, primary lithium batteries, alkaline batteries, or any other form of power storage. In some cases, power source 135 may be a wired power source. Including power source 135 on neckband 105 instead of on eyewear device 102 may help better distribute the weight and heat generated by power source 135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 100 and/or virtual-reality system 1200 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

EXAMPLE EMBODIMENTS

Example 1: An optical device may include (i) a heat source that produces heat while operating, (ii) a thermally conductive optical element that is optically transparent and that dissipates the heat produced by the heat source, and (iii) a thermally conductive connector that transfers the heat between the heat source and the thermally conductive optical element.

Example 2: The optical device of example 1, where the heat source comprises a display element of the optical device.

Example 3: The optical device of examples 1-2, wherein the display element comprises an organic light emitting diode screen.

Example 4: The optical device of examples 1-3, wherein the heat source comprises a computing chip.

Example 5: The optical device of examples 1-4, where the computing chip comprises a system-on-a-chip integrated circuit.

Example 6: The optical device of examples 1-5, where the thermally conductive optical element comprises silicon carbide.

Example 7: The optical device of examples 1-6, where the thermally conductive optical element comprises optically transparent ceramics.

Example 8: The optical device of examples 1-7, where the thermally conductive optical element comprises a thermally conductive film affixed to a non-thermally-conductive optical element.

Example 9: The optical device of examples 1-8, wherein the thermally conductive optical element comprises a layer of optically transparent gemstone.

Example 10: The optical device of examples 1-9, where the thermally conductive optical element comprises one or more lenses of a head-mounted display.

Example 11: The optical device of examples 1-10, wherein the thermally conductive optical element comprises an optical waveguide.

Example 12: The optical device of examples 1-11, where the thermally conductive connector comprises graphite.

Example 13: The optical device of examples 1-12, where the thermally conductive connector comprises conductive foam.

Example 14: The optical device of examples 1-13, where wherein the thermally conductive connector comprises a gas in a controlled gap between the heat source and the thermally conductive optical element.

Example 15: The optical device of examples 1-14, where the thermally conductive connector comprises a thermal strap.

Example 16: The optical device of examples 1-15, where the optical device comprises a head-mounted display for interacting with augmented reality environments.

Example 17: The optical device of examples 1-16 may further include an additional thermally conductive connector that connects the thermally conductive optical element to a heat sink.

Example 18: The optical device of examples 1-17, where the thermally conductive optical element dissipates the heat via convection.

Example 19: A method for assembling an optical device may include (i) identifying a component of an optical device that comprises a heat source that produces heat while operating, (ii) identifying a thermally conductive optical element of the optical device that is optically transparent and that dissipates the heat produced by the heat source, and (iii) connecting the heat source and the thermally conductive optical element via a thermally conductive connector that transfers the heat between the heat source and the thermally conductive optical element.

Example 20: A system may include (i) a heat source that produces heat while operating, (ii) a thermally conductive optical element that is optically transparent and that dissipates the heat produced by the heat source, (iii) a thermally conductive connector that transfers the heat between the heat source and the thermally conductive optical element, and (iv) a frame that is configured to be worn on a user's head and that houses the heat source, thermally conductive optical element, and thermally conductive connector.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical device comprising:
   a heat source that produces heat while operating;
   a thermally conductive optical element that is optically transparent and that dissipates the heat produced by the heat source, wherein the thermally conductive optical element transmits light waves and directly facilitates presentation of visual data to a user; and
   a thermally conductive connector that transfers the heat between the heat source and the thermally conductive optical element,
   wherein the optical device corresponds to an augmented reality device.

2. The optical device of claim 1, wherein the heat source comprises a display element of the optical device.

3. The optical device of claim 2, wherein the display element comprises an organic light emitting diode screen.

4. The optical device of claim 1, wherein the heat source comprises a computing chip.

5. The optical device of claim 4, wherein the computing chip comprises a system-on-a-chip integrated circuit.

6. The optical device of claim 1, wherein the thermally conductive optical element comprises silicon carbide.

7. The optical device of claim 1, wherein the thermally conductive optical element comprises optically transparent ceramics.

8. The optical device of claim 1, wherein the thermally conductive optical element comprises a thermally conductive film affixed to a non-thermally-conductive optical element.

9. The optical device of claim 1, wherein the thermally conductive optical element comprises a layer of optically transparent gemstone.

10. The optical device of claim 1, wherein the thermally conductive optical element comprises one or more lenses of a head-mounted display.

11. The optical device of claim 1, wherein the thermally conductive optical element comprises an optical waveguide.

12. The optical device of claim 1, wherein the thermally conductive connector comprises graphite.

13. The optical device of claim 1, wherein the thermally conductive connector comprises conductive foam.

14. The optical device of claim 1, wherein the thermally conductive connector comprises a gas in a controlled gap between the heat source and the thermally conductive optical element.

15. The optical device of claim 1, wherein the thermally conductive connector comprises a thermal strap.

16. The optical device of claim 1, wherein the optical device comprises a head-mounted display for interacting with augmented reality environments.

17. The optical device of claim 1, further comprising an additional thermally conductive connector that connects the thermally conductive optical element to a heat sink.

18. The optical device of claim 1, wherein the thermally conductive optical element dissipates the heat via convection.

19. A method comprising:
    identifying a component of an optical device that comprises a heat source that produces heat while operating;
    identifying a thermally conductive optical element of the optical device that is optically transparent and that dissipates the heat produced by the heat source, wherein the thermally conductive optical element transmits light waves and directly facilitates presentation of visual data to a user; and
    connecting the heat source and the thermally conductive optical element via a thermally conductive connector that transfers the heat between the heat source and the thermally conductive optical element,
    wherein the optical device corresponds to an augmented reality device.

20. A system comprising:
    a heat source that produces heat while operating;
    a thermally conductive optical element that is optically transparent and that dissipates the heat produced by the heat source, wherein the thermally conductive optical element transmits light waves and directly facilitates presentation of visual data to a user;
    a thermally conductive connector that transfers the heat between the heat source and the thermally conductive optical element; and
    a frame that is configured to be worn on a user's head and that houses the heat source, thermally conductive optical element, and thermally conductive connector,
    wherein the optical device corresponds to an augmented reality device.

* * * * *